(12) United States Patent
Lin

(10) Patent No.: US 8,427,457 B2
(45) Date of Patent: Apr. 23, 2013

(54) DISPLAY DRIVER AND BUILT-IN-PHASE-CALIBRATION CIRCUIT THEREOF

(75) Inventor: Li-Pin Lin, Tainan County (TW)

(73) Assignee: Himax Technologies Limited, Tainan (TW)

(*) Notice: Subject to any disclaimer, the term of this patent is extended or adjusted under 35 U.S.C. 154(b) by 1462 days.

(21) Appl. No.: 12/035,931

(22) Filed: Feb. 22, 2008

(65) Prior Publication Data

US 2009/0213097 A1 Aug. 27, 2009

(51) Int. Cl.
*G09G 5/00* (2006.01)
*H03L 7/06* (2006.01)

(52) U.S. Cl. .......................... 345/204; 327/158

(58) Field of Classification Search ............ 345/98–100, 345/204, 691–693; 348/536–538; 327/161–163; 713/400, 401; 375/355
See application file for complete search history.

(56) References Cited

U.S. PATENT DOCUMENTS

| | | | |
|---|---|---|---|
| 6,029,250 A * | 2/2000 | Keeth | 713/400 |
| 7,310,397 B2 * | 12/2007 | Smith et al. | 375/355 |
| 7,460,630 B2 * | 12/2008 | Kato et al. | 375/372 |
| 7,586,348 B2 * | 9/2009 | Kim | 327/163 |
| 7,782,103 B2 * | 8/2010 | Iwata | 327/156 |
| 2005/0242864 A1 * | 11/2005 | Kawasaki et al. | 327/261 |

\* cited by examiner

*Primary Examiner* — Rodney Amadiz
(74) *Attorney, Agent, or Firm* — J.C. Patents

(57) ABSTRACT

A phase-calibration circuit including a pattern generator, a phase adjuster, a rotate register unit, a detector unit, and an optimization unit is disclosed. The pattern generator generates a clock pattern and a data pattern for a target circuit. The phase adjuster adjusts a phase between a first clock and a first data output from the target circuit according to a control data for outputting a second clock and a second data. The rotate register unit provides the control data to the phase adjuster. The detector unit detects phase relationship between the second clock and the second data for outputting a detection result. The optimization unit records the control data output from the rotate register unit in accordance with the detection result, and selects one of the control data as a calibration control data, and controls the rotate register unit to output the calibration control data to the phase adjuster.

20 Claims, 11 Drawing Sheets

DISPLAY DRIVER AND BUILT-IN-PHASE-CALIBRATION CIRCUIT THEREOF

BACKGROUND OF THE INVENTION

1. Field of the Invention

The present invention relates to a signal phase calibration method. More particularly, the present invention relates to a signal phase calibration circuit and a display driver with a built-in-phase-calibration circuit.

2. Description of Related Art

Signal offsets may occur due to factors such as fabrication process, environment, signal transmission path, and etc., and therefore cause a setup time problem and a hold time problem. FIG. 1A is a diagram illustrating a signal path. FIG. 1B is a timing diagram of the signals of FIG. 1A. A signal source (a transmitter 110) transmits the signals (clock CLK10 and data D10) to a receiver 130 via a signal path 120. Therefore, the receiver 130 may output a corresponding clock CLK11 and a data D11 to a secondary circuit (not shown) according to the received clock CLK10 and the data D10.

The clock CLK11 and the data D11 may have signal offsets during transmission. In FIG. 1B, signal offsets occur such that the transition of the data D11 is close to the rising edge of the clock CLK11. Thus a set-up time problem is caused because the rising edge of the clock CLK11 appears within the required setup time for the transition of the data D11, and the data D11 would be erroneously sampled by the secondary circuit (not shown) based on the rising edge of the clock CLK11. Moreover, a hold time problem may be caused if the hold time of the clock CLK11 after the rising edge is not long enough.

FIG. 2A is a block diagram illustrating a conventional system that uses delay buffer for modifying signal offsets. FIG. 2B is a timing diagram of the signals of FIG. 2A. The delay buffer 240 with a fixed delay time may be applied to delay the clock CLK11, so as to generate a clock CLK12 for eliminating the signal offsets. However, the fixed delay buffer cannot flexibly modify the offsets of the digital signals along with a fabrication process variation and a voltage variation etc.

SUMMARY OF THE INVENTION

Accordingly, the present invention is directed to a phase-calibration circuit, which may detect a fabrication process variation and a working voltage variation, and flexibly select a required delay time, so as to calibrate a setup problem and a hold time problem occurred due to delay offsets of digital signals within a chip.

The present invention is directed to a display driver having a built-in-signal phase calibration circuit, by which a required delay time may be flexibly selected along with a fabrication process variation and a working voltage variation, so as to calibrate a delay offset of a receiver.

In accordance with the aforementioned objectives of the present invention, a phase-calibration circuit for calibrating a target circuit is provided. The phase-calibration circuit includes a pattern generator, a phase adjuster, a rotate register unit, a detector unit, and an optimization unit. The pattern generator generates a clock pattern and a data pattern for a target circuit. The phase adjuster receives a first clock and a first data from the target circuit and adjusts the phase relationship between the first clock and the first data according to a control data for outputting a second clock and a second data. The rotate register unit provides the control data to the phase adjuster and changes the control data according to a predetermined timing. The detector unit is coupled to the phase adjuster and detects a phase relationship between the second clock and the second data for outputting a detection result. The optimization unit is coupled to the detector unit and the rotate register unit and records the control data output from the rotate register unit in accordance with the detection result to select one of the control data as a calibration control data, and controls the rotate register unit to output the calibration control data to the phase adjuster.

The present invention provides a display driver including a receiver and a phase-calibration circuit. The receiver is used for receiving an external signal. The phase-calibration circuit is built within the display driver for calibrating the receiver. The phase-calibration circuit includes a pattern generator, a phase adjuster, a rotate register unit, a detector unit, and an optimization unit. The pattern generator generates a clock pattern and a data pattern for the receiver. The phase adjuster receives a first clock and a first data from the receiver and adjusts the phase relationship between the first clock and the first data according to a control data for outputting a second clock and a second data. The rotate register unit provides the control data to the phase adjuster and changes the control data according to a predetermined timing. The detector unit is coupled to the phase adjuster and detects a phase relationship between the second clock and the second data for outputting a detection result. The optimization unit is coupled to the detector unit and the rotate register unit and records the control data output from the rotate register unit in accordance with the detection result to select one of the control data as a calibration control data, and controls the rotate register unit to output the calibration control data to the phase adjuster.

The phase-calibration circuit of the present invention may detect an output of the target circuit via a detector unit and dynamically select a required delay time according to the detection result. Therefore, the setup problem and the hold time problem occurred due to delay offsets of digital signals may be dynamically calibrated according to the present invention.

In order to make the aforementioned and other objects, features and advantages of the present invention comprehensible, a preferred embodiment accompanied with figures is described in detail below.

DESCRIPTION OF EMBODIMENTS

Figure 1A:
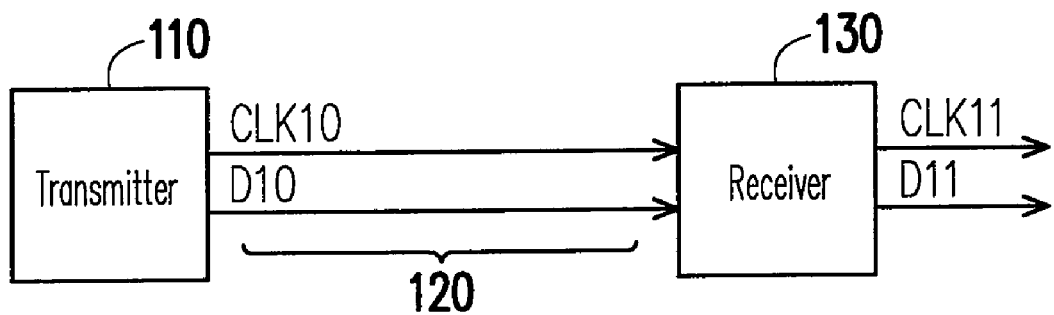
FIG. 1A is a diagram illustrating a signal path of digital signals.
Figure 1B:
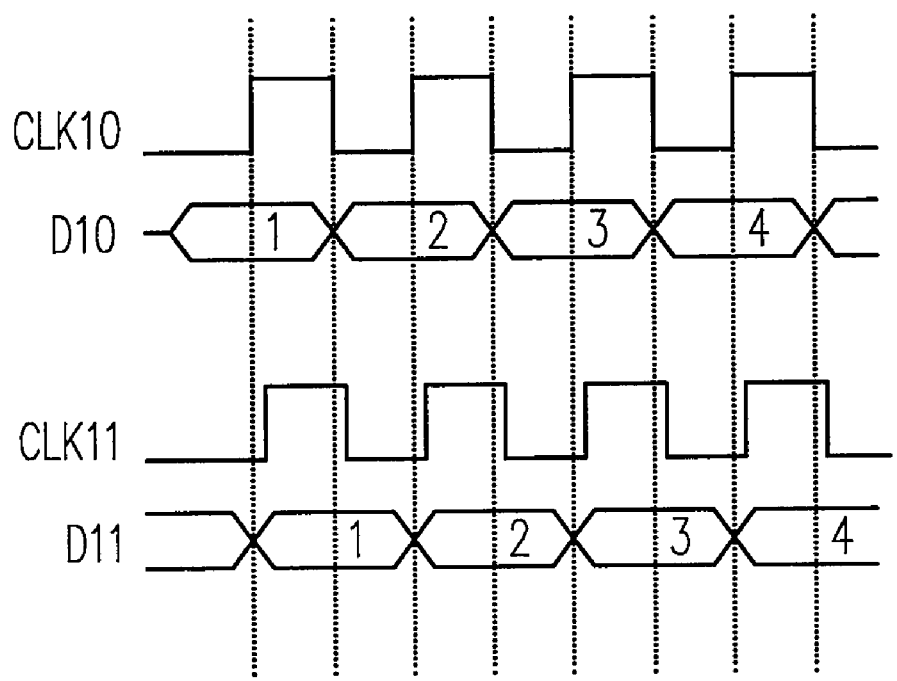
FIG. 1B is a timing diagram of the signals of FIG. 1A.
Figure 2A:
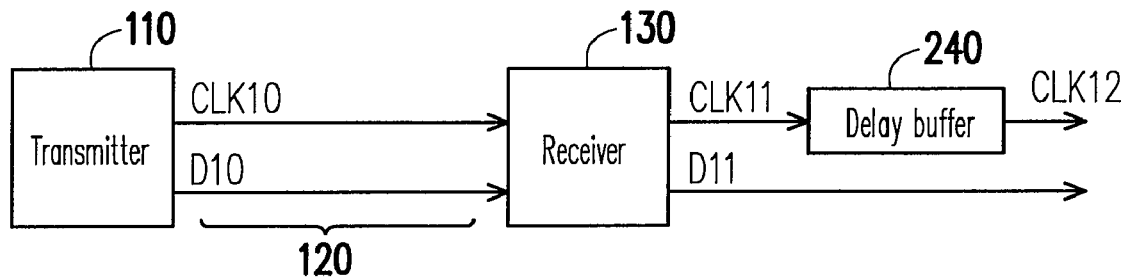
FIG. 2A is a block diagram illustrating a situation when a set of delay buffer is used for modifying an offset of digital signals according to a conventional technique.
Figure 2B:
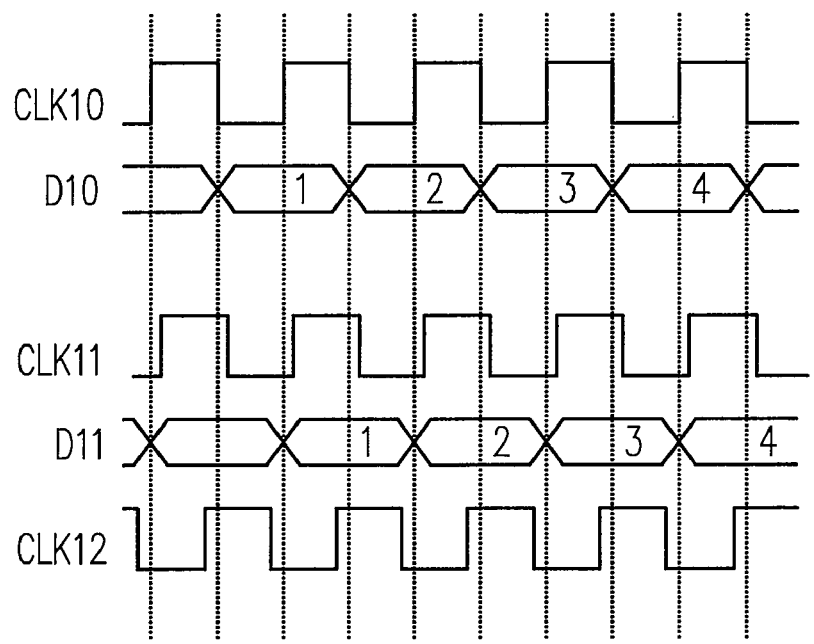
FIG. 2B is a timing diagram of the signals of FIG. 2A.
Figure 3:
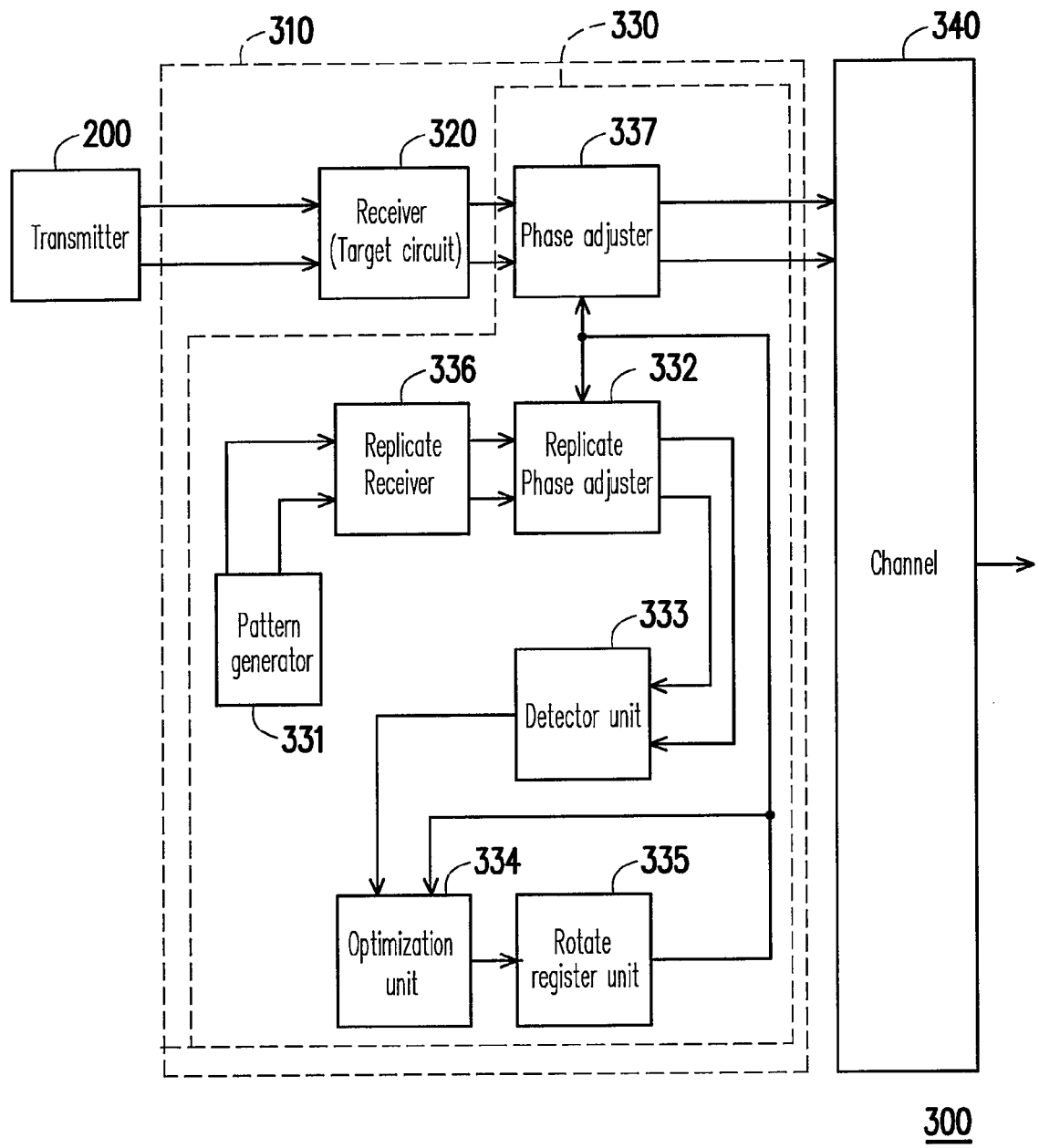
FIG. 3 is a block diagram illustrating an integrated circuit with a built-in-phase-calibration circuit according to an embodiment of the present invention.

FIG. 3 is a block diagram illustrating an integrated circuit with a built-in-phase-calibration circuit according to an embodiment of the present invention. The integrated circuit with the built-in-phase-calibration circuit is exemplified by a display driver 300. The display driver 300 includes an interface circuit 310 and a channel 340 for receiving a signal from a transmitter 200 to drive a panel (not shown).

The interface circuit 310 includes a receiver 320 and a phase-calibration circuit 330. The receiver 320 utilizes, for example, a reduced swing differential signalling (RSDS) transmission interface or other transmission interfaces to receive signals from the transmitter 200. If necessary, the receiver 320 may also convert the received signals into another signal format required by the interior of the display driver 300. The phase-calibration circuit 330 includes a pattern generator 331, a replicate receiver 336, a replicate phase adjusters 332, a phase adjusters 337, a rotate register unit 335, a detector unit 333, and an optimization unit 334. The phase-calibration circuit 330 receives a clock and a data from a target circuit (e.g. the receiver 320) and adjusts a phase between the clock and the data, so as to output an adjusted clock and an adjusted data to a secondary circuit (e.g. the channel 340).

The circuit design of the replicate receiver 336 may be identical to that of the receiver 320, and the circuit designs of the replicate phase adjuster 332 may be identical to the phase adjuster 337. Since the replicate receiver 336 and the receiver 320 are all disposed in the display driver 300, the two receivers (320 and 336) are fabricated by the same fabrication process, and the features (including delay offset of the signals) of the two receivers are almost identical. In other words, the replicate receiver 336 and the replicate phase adjuster 332 may be regarded as respective replicas of the receiver 320 and the phase adjuster 337.

In the calibration stage, the pattern generator 331 generates a clock pattern and a data pattern for the replicate receiver 336, and the replicate receiver 336 outputs a first clock and a first data to the replicate phase adjuster 332 according to the clock pattern and the data pattern. Then the replicate phase adjuster 332 adjusts the phase relationship between the first clock and the first data according to the control data output from the rotate register unit 335, so as to output a second clock and a second data. The rotate register unit 335 generates the control data according to a predetermined timing and provides the control data to the replicate phase adjusters 332 and the phase adjuster 337. The detector unit 333 is coupled to the replicate phase adjuster 332 and detects a phase relationship between the second clock and the second data for outputting a detection result. The optimization unit 334 is coupled to the detector unit 333 and the rotate register unit 335, and records the control data output from the rotate register unit 335 in accordance with the detection result output from the detector unit 333 to select one of the control data as a calibration control data, and controls the rotate register unit 335 to output the control data to the phase adjusters 332 and 337. Operation of the phase-calibration circuit 330 will be described in detail below.

Figure 4:
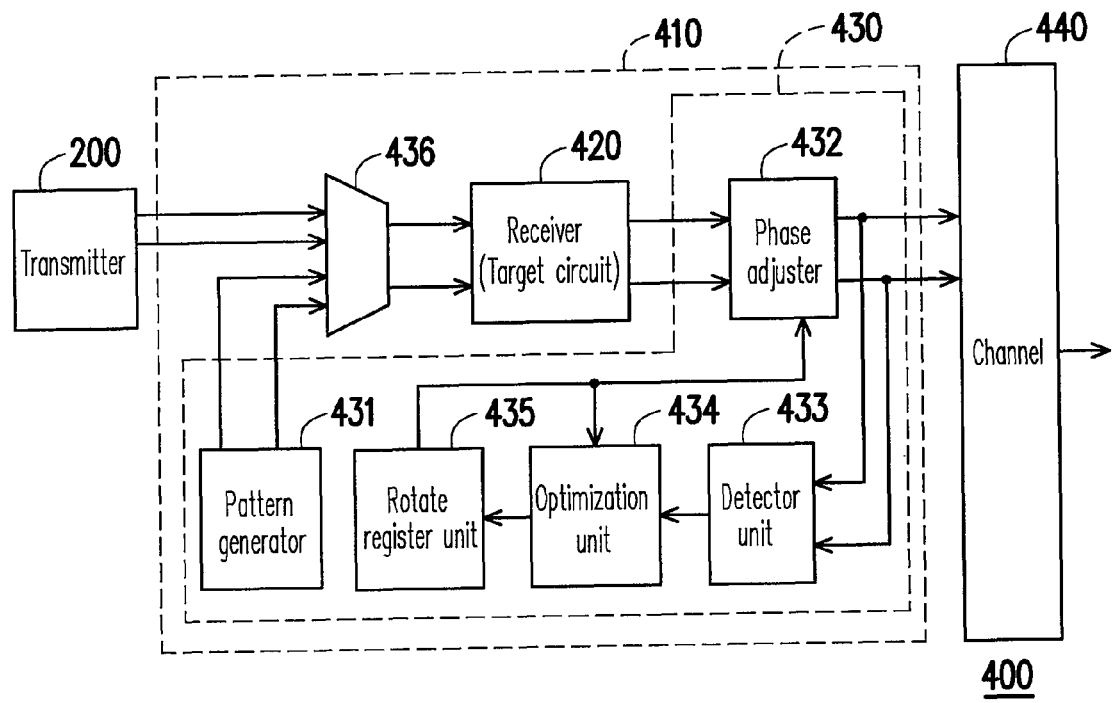
FIG. 4 is a block diagram illustrating an integrated circuit with a built-in-phase-calibration circuit according to another embodiment of the present invention.

It should be noted that the integrated circuit with the built-in-phase-calibration circuit is not limited to the aforementioned embodiment. For example, FIG. 4 is a block diagram illustrating an integrated circuit with a built-in-phase-calibration circuit according to another embodiment of the present invention. The integrated circuit is exemplified by a display driver 400. The display driver 400 includes an interface circuit 410 and a channel 440 for receiving a signal from the transmitter 200 to drive a panel (not shown).

The interface circuit 410 includes a receiver 420 and a phase-calibration circuit 430. The receiver 420 utilizes, for example, a reduced swing differential signalling (RSDS) transmission interface or other transmission interfaces to receive signals from the transmitter 200. If necessary, the receiver 420 may also convert the received signals into another signal format required by the interior of the display driver 400. The phase-calibration circuit 430 is built in the display driver 400 for calibrating the target circuit (e.g. the receiver 420). The phase-calibration circuit 430 includes a pattern generator 431, a phase adjuster 432, a rotate register unit 435, a detector unit 433, and an optimization unit 434. The phase-calibration circuit 430 receives a clock and a data from the receiver 420 and adjusts a phase relationship between the clock and the data, so as to output an adjusted clock and an adjusted data to a secondary circuit (e.g. the channel 440) in the interior of the display driver 400.

In the calibration stage, the selector 436 outputs a clock pattern and a data pattern from the pattern generator 431 to the receiver 420. The receiver 420 outputs a first clock and a first data to the phase adjuster 432 according to the clock pattern and the data pattern. The phase adjuster 432 receives the first clock and the first data from the receiver 420 and adjusts the phase relationship between the first clock and the first data according to the control data output from the rotate register unit 435, so as to output a second clock and a second data. The rotate register unit 435 changes the control data according to a predetermined timing and provides the control data to the phase adjuster 432. The detector unit 433 is coupled to the phase adjuster 432 and detects a phase relationship between the second clock and the second data for outputting a detection result. The optimization unit 434 is coupled to the detector unit 433 and the rotate register unit 435, and records the control data output from the rotate register unit 435 in accordance with the detection result output from the detector unit 433 to select one of the control data as a calibration control data, and controls the rotate register unit 435 to output the calibration control data to the phase adjusters 432.

Figure 5:
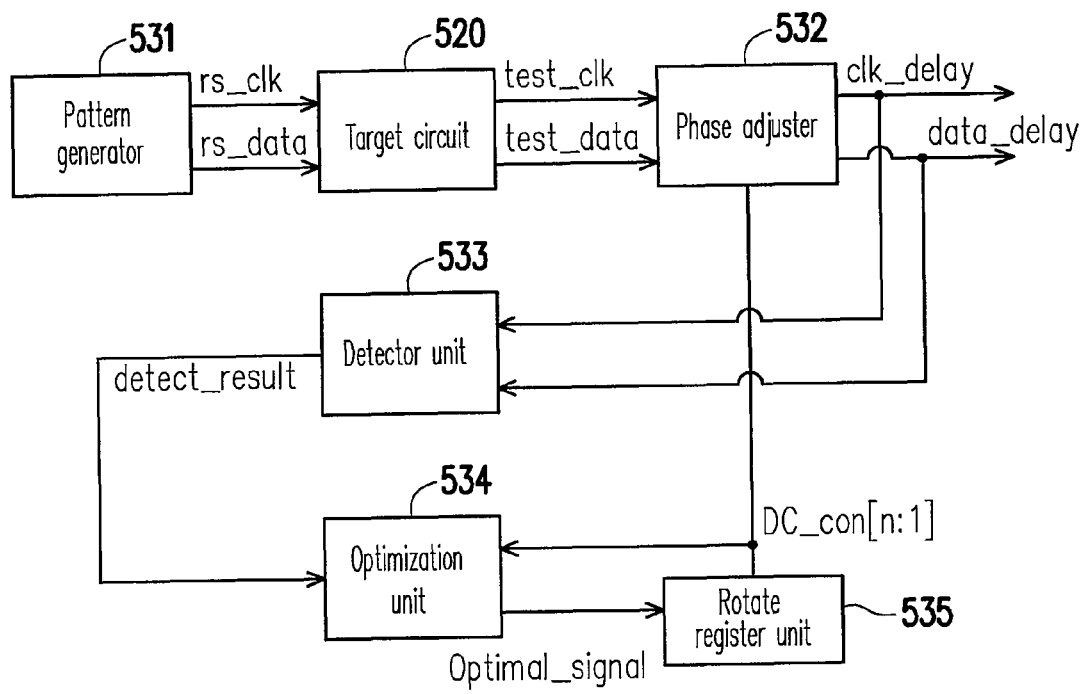
FIG. 5 is an example of a phase-calibration circuit according to the present invention.

The operations of the phase-calibration circuits 330 and/or 430 are illustrated by the equivalent circuit of FIG. 5. The phase-calibration circuit of FIG. 5 is used for calibrating a target circuit 520. The target circuit 520 are equivalent to the replicate receiver 336 of FIG. 3, and are equivalent to the receiver 420 of FIG. 4.

Referring to FIG. 5, the phase-calibration circuit includes a pattern generator 531, a phase adjuster 532, a detector unit 533, an optimization unit 534, and a rotate register unit 535, which are respectively equivalent to the pattern generator 331, the replicate phase adjuster 332, the detector unit 333, the optimization unit 334 and the rotate register 335 of FIG. 3, and are respectively equivalent to pattern generator 431, the phase adjuster 432, the detector unit 433, the optimization unit 434 and the rotate register 435 of FIG. 4.

Figure 6:
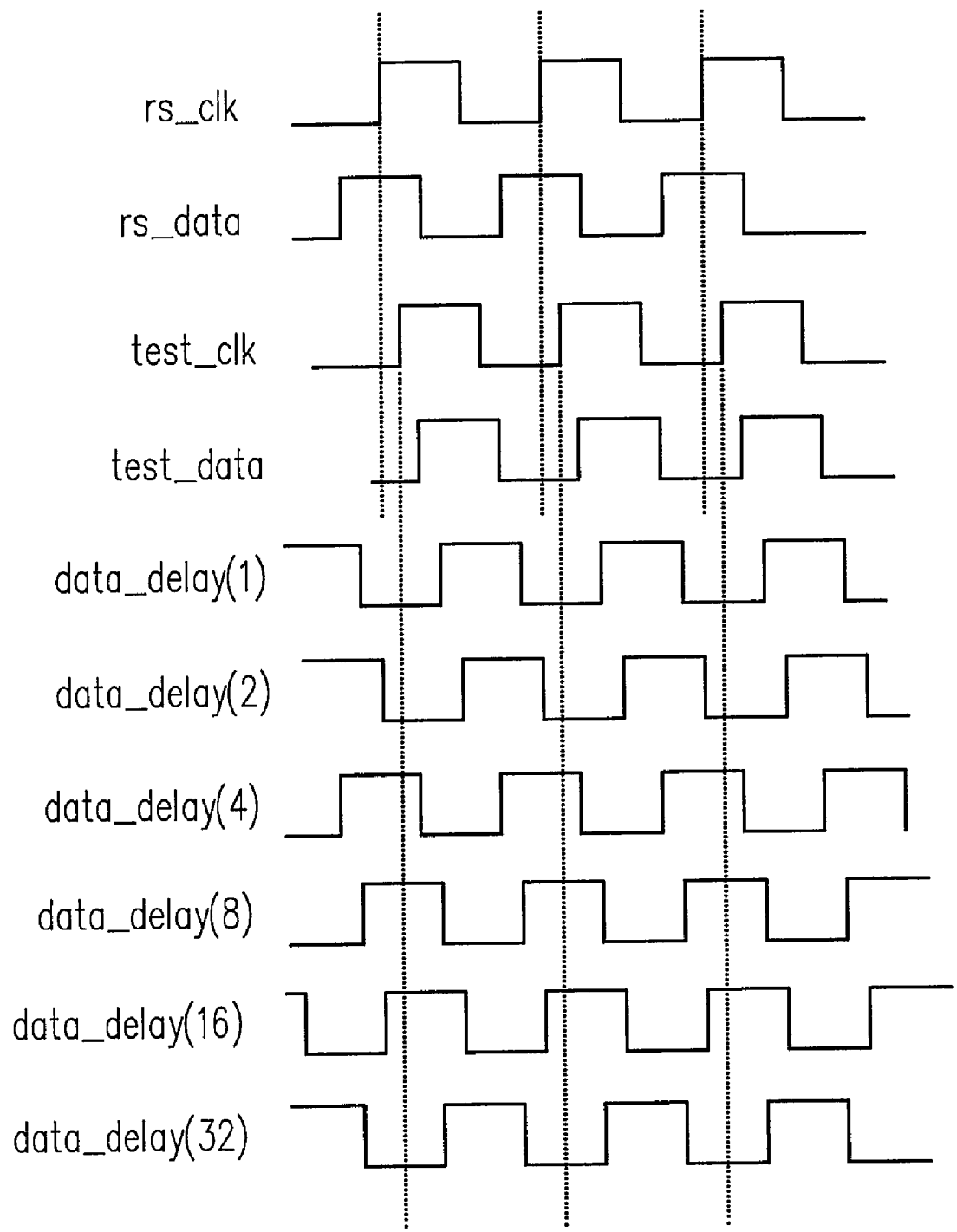
FIG. 6 is a signal timing diagram of the phase-calibration circuit of FIG. 5 according to an embodiment of the present invention.

FIG. 6 is a signal timing diagram of the phase-calibration circuit shown in FIG. 5. Referring to FIG. 5 and FIG. 6, the pattern generator 531 generates a clock pattern rs_clk and a data pattern rs_data for the target circuit 520. Signal offset of the clock pattern rs_clk and/or the data pattern rs_data may be occurred after the clock pattern rs_clk and the data pattern rs_data pass through signal paths within the target circuit 520.

The rotate register unit 535 provides a control data DC_con[n:1] to the phase adjuster 532, and changes the control data DC_con[n:1] according to a predetermined timing. For example, assuming n=6 (i.e. the control data DC_con[n:1] has 6 bits), the rotate register unit 535 then sequentially outputs the control data DC_con[n:1] as 000001b, 000010b, 000100b, 001000b, 010000b, 100000b, 000001b, 000010b, and etc. Decimally, the control data DC_con[n:1] changes to 1, 2, 4, 8, 16, 32, 1, 2, . . . according to the predetermined timing.

The phase adjuster 532 receives the first clock test_clk and the first data test_data from the target circuit 520, and adjusts a phase relationship between the first clock test_clk and the first data test_data according to the control data DC_con[n:1] to output a second clock clk_delay and a second data data_delay. In one embodiment, the phase of the first clock test_clk is not changed by the phase adjuster 532 (i.e. test_clk=clk_delay), and the phase of the first data test_data is adjusted by the phase adjuster 532 according to the control data DC_con[n:1], so as to output the second data data_delay. If the control data DC_con[n:1]=1, the second data data_delay output from the phase adjuster 532 then may be shown as a waveform data_delay(1) of FIG. 6. If the control data DC_con[n:1]=2 (i.e. 000010b), the second data data_delay output from the phase adjuster 532 then may be shown as a waveform data_delay(2) of FIG. 6. Deduced by analogy, if the control data DC_con[n:1]=32 (i.e. 100000b), the second data data_delay output from the phase adjuster 532 then may be shown as a waveform data_delay(32) of FIG. 6.

The detector unit 533 is coupled to the phase adjuster 532 for receiving the second clock clk_delay and the second data data_delay, and detects the phase relationship between the second clock clk_delay and the second data data_delay for outputting a detection result detect_result. It is assumed that the detector unit 533 samples the second data data_delay according to a rising edge of the second clock clk_delay (which is identical to the phase of the first clock test_clk). Therefore, if the control data DC_con[n:1]=2, the second data data_delay (i.e. the waveform data_delay(2) of FIG. 6) sampled by the detector unit 533 is "0", and if the control data DC_con[n:1]=8, the second data data_delay (i.e. a waveform data_delay(8) of FIG. 6) sampled by the detector unit 533 is "1". According to the phase relationship between the clock pattern rs_clk and the data pattern rs_data generated by the pattern generator 531, the second data data_delay sampled by the detector unit 533 should be "1". Therefore, the detector unit 533 may judge whether an adjusting result of the phase adjuster 532 is correct according to the sampled second data data_delay, and may output the detection result detect_result according to the above judgement.

The optimization unit 534 is coupled to the detector unit 533 and the rotate register unit 535 for recording the control data Dc_con[n:1] output from the rotate register unit 535 according to the detection result detect_result to select one of the control data as a calibration control data, and controlling the rotate register unit 535 to output the calibration control data to the phase adjusters 532. For example, the control data DC_con[n:1] output from the rotate register unit 535 constantly changes in a sequence of 1, 2, 4, 8, 16, 32, 1, 2 . . . . According to the detection result detect_result, the optimization unit 534 may judge that when the control data DC_con[n:1] is 4, 8, or 16, the adjusting results of the phase adjuster 532 are correct. Therefore, the optimization unit 534 may select one of the control data 4, 8, and 16 as the calibration control data (for example, a middle value "8" is selected), and may control the rotate register unit 535 according to a signal Optimal_Signal to output the calibration control data "8" (i.e. DC_con[n:1]=001000b) to the phase adjusters 532. Therefore, the phase adjuster 532 may adjust the phase relationship between the first clock test_clk and the first data test_data output from the target circuit 520 according to the calibration control data "8" (control data DC_con[n:1]), so as to output the second clock clk_delay and the second data data_delay (referring to waveforms test_clk and data_delay(8) of FIG. 6).

Figure 7A:
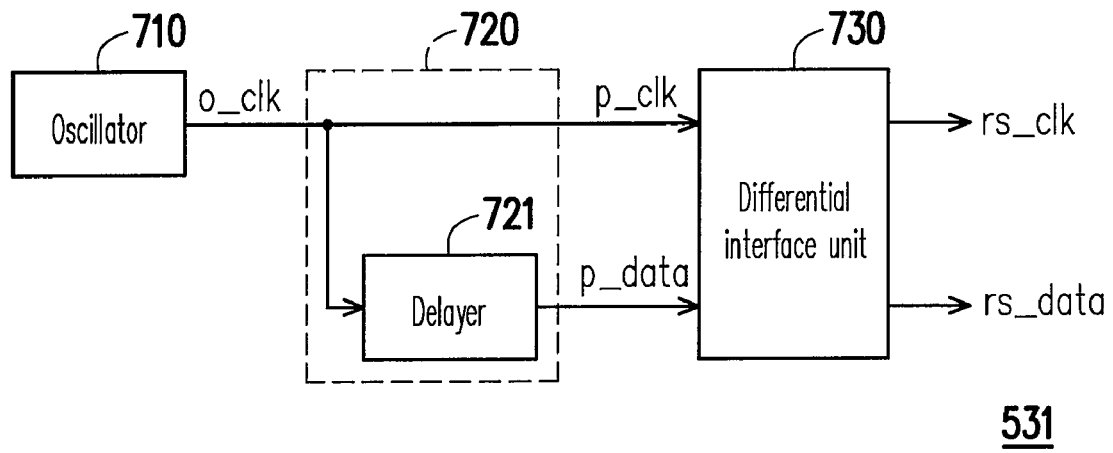
FIG. 7A is an example of the pattern generator of FIG. 5 according to an embodiment of the present invention.

FIG. 7A is an example of the pattern generator 531 of FIG. 5 according to an embodiment of the present invention. The pattern generator 531 may include an oscillator 710, a pattern unit 720 and a differential interface unit 730. The oscillator 710 provides a clock pattern o_clk for the pattern unit 720. The pattern unit 720 provides a clock pattern p_clk and a data pattern p_data for the differential interface unit 730 according to the clock pattern o_clk. The differential interface unit 730 converts the clock patter p_clk and the data pattern p_data output from the pattern unit 720 into the clock pattern rs_clk and the data pattern rs_data. The pattern unit 720 may include a delayer 721. In the present embodiment, the pattern unit 720 directly outputs the clock pattern o_clk as the clock pattern p_clk, and outputs the clock pattern o_clk via the delayer 721 as the data pattern p_data.

Figure 7B:
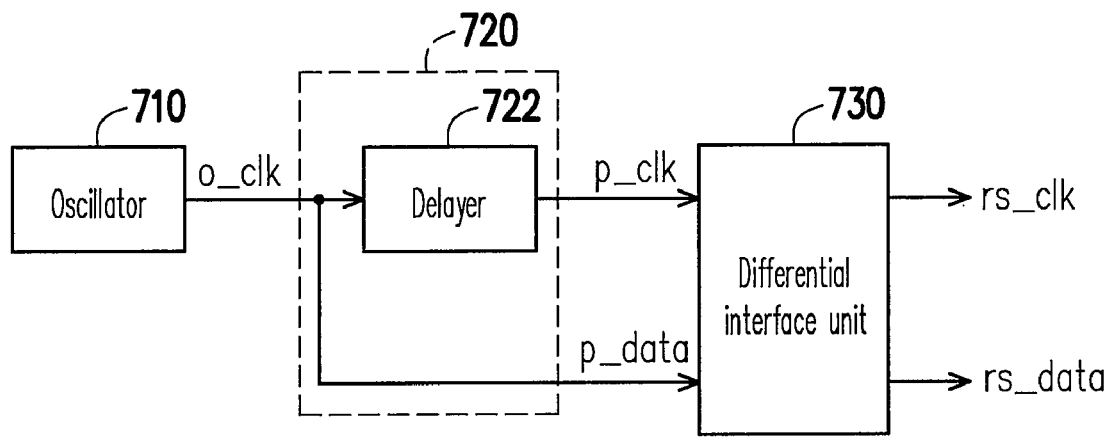
FIG. 7B is another example of the pattern generator of FIG. 5 according to an embodiment of the present invention.

However, embodiment of the pattern unit 720 is not limited thereof. For example, FIG. 7B is another example of the pattern generator 531 of FIG. 5 according to an embodiment of the present invention. In this embodiment, the pattern unit 720 may include a delayer 722. The pattern unit 720 directly outputs the clock pattern o_clk as the data pattern p_data, and outputs the clock pattern o_clk via the delayer 722 as the clock pattern p_clk.

The differential interface unit 730 may convert the clock patter p_clk and the data pattern p_data output from the pattern unit 720 into signals in accordance with the RSDS transmission interface or other signal transmission interfaces. Certainly, the differential interface unit 730 may also be omitted, such that the pattern generator 531 may directly output the clock pattern p_clk and the data pattern p_data output from the pattern unit 720 as the clock pattern rs_clk and the data pattern rs_data.

Figure 8:
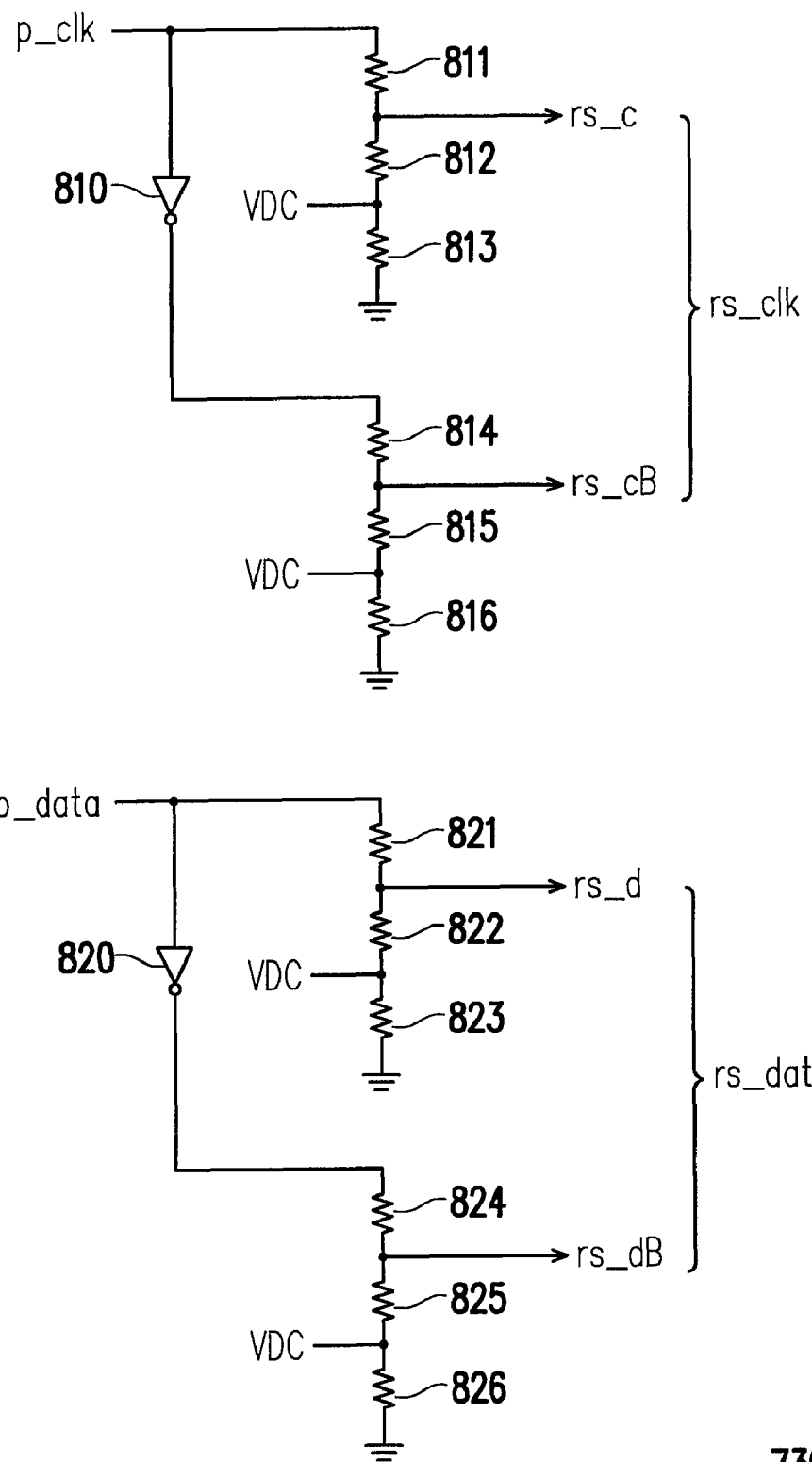
FIG. 8 is an example of the differential interface unit of FIG. 5 according to an embodiment of the present invention.

FIG. 8 is an example of the differential interface unit 730 of FIG. 5 according to an embodiment of the present invention. The differential interface unit 730 includes inverters 810 and 820, and resistors 811, 812, 813, 814, 815, 816, 821, 822, 823, 824, 825 and 826. An input terminal of the inverter 810 receives the clock pattern p_clk, and an input terminal of the inverter 820 receives the data pattern p_data. The resistors 811-813 are serially connected between the clock pattern p_clk and a ground voltage, wherein a common node between the resistor 812 and the resistor 813 is coupled to a reference voltage VDC, and a common node between the resistor 811 and the resistor 812 may output a signal rs_c. The resistors 814-816 are serially connected between an output terminal of the inverter 810 and the ground voltage, wherein a common node between the resistor 815 and the resistor 816 is coupled to the reference voltage VDC, and a common node between the resistor 814 and the resistor 815 may output a signal rs_cB. The signals rs_c and rs_cB are the output clock pattern rs_clk of the differential interface unit 730. Moreover, the resistors 821-823 are serially connected between the data pattern p_data and the ground voltage, wherein a common node between the resistor 822 and the resistor 823 is coupled to the reference voltage VDC, and a common node between the resistor 821 and the resistor 822 may output a signal rs_d. The resistors 824-826 are serially connected between an output terminal of the inverter 820 and the ground voltage, wherein a common node between the resistor 825 and the resistor 826 is coupled to the reference voltage VDC, and a common node between the resistor 824 and the resistor 825 may output a signal rs_dB. The signals rs_d and rs_dB are the output data pattern rs_data of the differential interface unit 730.

Figure 9:
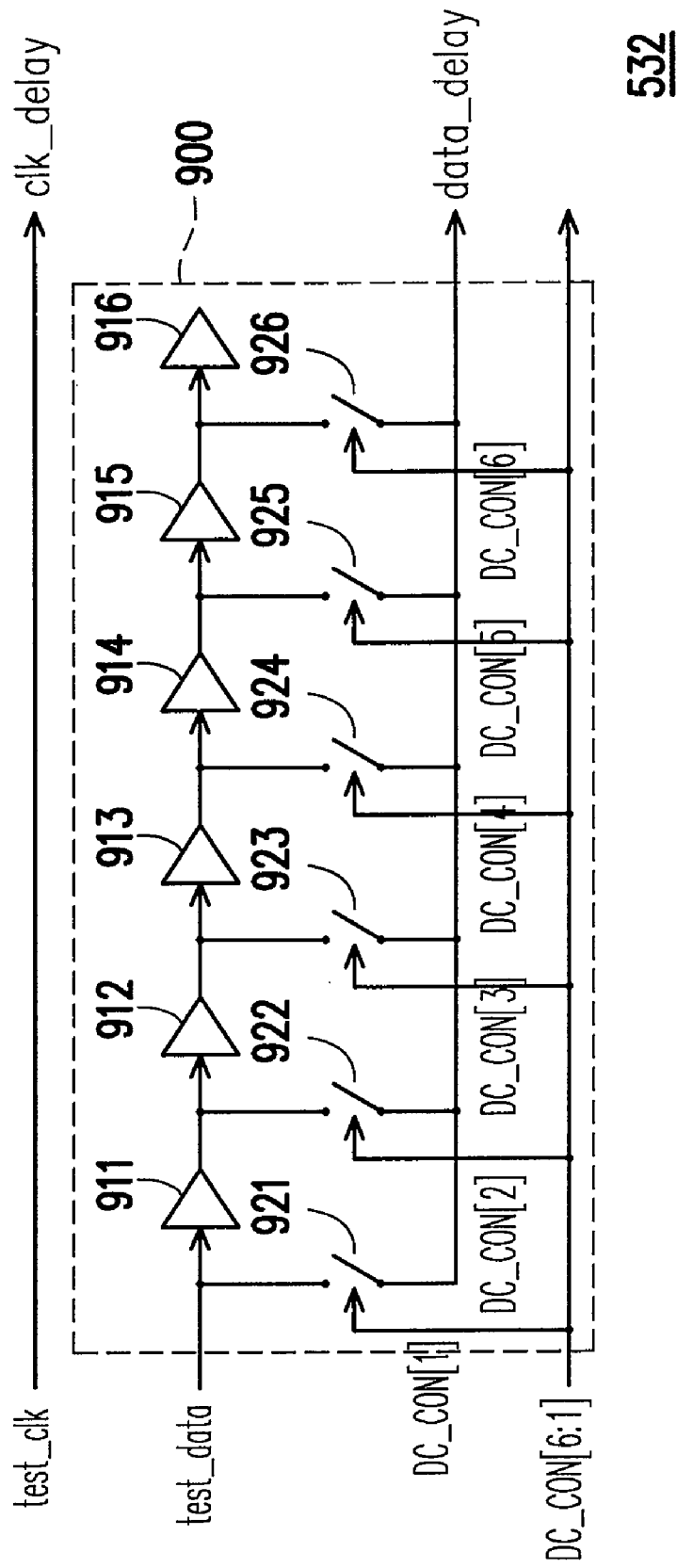
FIG. 9 is an example of the phase adjuster of FIG. 5 according to an embodiment of the present invention.

Here, the control data DC_con[n:1] is also assumed to be a 6-bits data (i.e. DC_con[6:1]). FIG. 9 is an example of the phase adjuster 532 of FIG. 5 according to an embodiment of the present invention. The phase adjuster 532 includes a delay selector 900 for receiving the first data test_data output from the target circuit 520, and delaying the first data test_data according to the control data DC_con[6:1] to output the second data data_delay. In the present embodiment, the phase adjuster 532 directly outputs the first clock test_clk output from the target circuit 520 as the second clock clk_delay, and adjusts the phase of the first data test_data output from the target circuit 520 via the delay selector 900.

Referring to FIG. 9, the delay selector 900 includes a delayer unit string and switches 921, 922, 923, 924, 925 and 926. The delayer unit string is formed by serially connecting the delayers 911, 912, 913, 914, 915 and 916. Wherein, an input terminal of the first delayer 911 of the delayer unit string receives the first data test_data from the target circuit 520. A first end of the switch 921 receives the first data test_data. The first ends of the switches 922, 923, 924, 925 and 926 are respectively coupled to the output terminals of the delayers 912-915. The second ends of the switches 921-926 are connected with each other for outputting the second data data_delay. One of the switches 921-926 is turned on under control of one of the bits (i.e. DC_con[1], DC_con[2], DC_con[3], DC_con[4], DC_con[5] or DC_con[6]) of the control data DC_con[6:1], so as to output the second data data_delay. Therefore, the phase relationship between the second data data_delay and the second clock clk_delay may be adjusted according to the control data DC_con[6:1].

Embodiment of the phase adjuster 532 is not limited to that shown in FIG. 9, and it will be apparent to those skilled in the art that other kinds of phase adjusters may also be applied. For example, the delay selector may be coupled between the first clock test_clk and the second clock clk_delay, such that the delay selector may delay the first clock test_clk output from the target circuit according to the control data DC_con[6:1], so as to obtain the second clock clk_delay. Moreover, the first data test_data may also be directly output as the second data data_delay.

Figure 10:
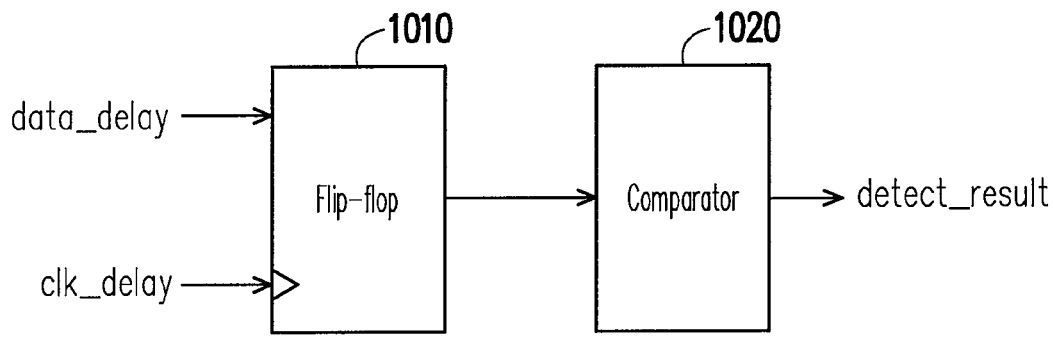
FIG. 10 is an example of the detector unit of FIG. 5 according to an embodiment of the present invention.

FIG. 10 is an example of the detector unit 533 of FIG. 5 according to an embodiment of the present invention. In the present embodiment, the detector unit 533 includes a flip-flop 1010 and a comparator 1020. The flip-flop 1010 latches the second data data_delay according to the second clock clk_delay. The comparator 1020 detects whether or not the latched data of the flip-flop 1010 is correct, and outputs the detection result detect_result. According to the phase relationship between the clock pattern rs_clk and the data pattern rs_data generated by the aforementioned pattern generator 531, the comparator 1020 may compare whether the second data data_delay latched by the flip-flop 1010 is "1". Therefore, the detector unit 533 may judge whether or not the adjusting result of the phase adjuster 532 is correct according to the latched second data data_delay, and may output the detection result detect_result according to the above judgement.

The comparator 1020 may be embodied by an AND gate (not shown). Wherein, a first input terminal of the AND gate is coupled to an output terminal of the flip-flop 1010, a second input terminal of the AND gate receives a logic value (logic "1"), and an output terminal of the AND gate outputs the detection result detect_result. Certainly, embodiment of the aforementioned comparator 1020 is not limited thereof.

Figure 11:
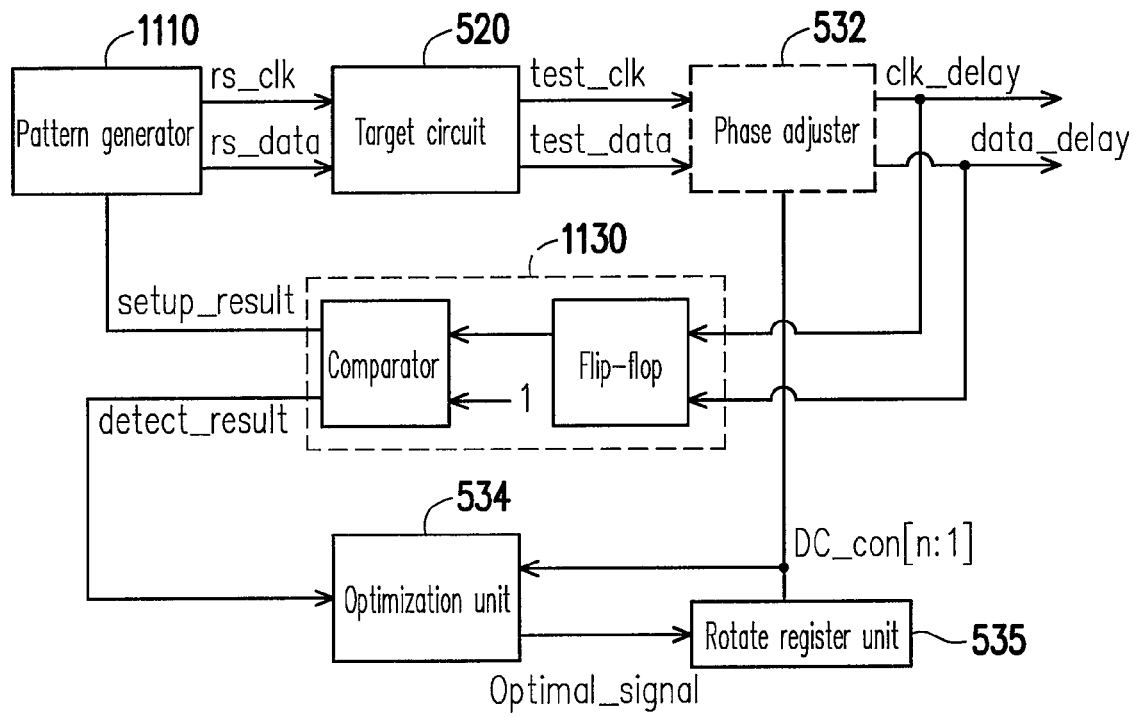
FIG. 11 is another example of a phase-calibration circuit according to an embodiment of the present invention.

Embodiments of the present invention are not limited by the aforementioned description. For example, FIG. 11 is an example of another phase-calibration circuit according to an embodiment of the present invention. The embodiment of FIG. 11 is similar to that of FIG. 5, the detailed description thereof will not be repeated. Compared to the embodiment of FIG. 5, the detector unit 1130 of FIG. 11 may further output a pattern setup signal setup_result to the pattern generator 1110 according to the phase relationship between the second clock clk_delay and the second data data_delay, and the pattern generator 1110 may further adjust the phase of the data pattern rs_data according to the pattern setup signal setup_result. For example, when the pattern setup signal setup_result is logic "0", the phase relationship between the clock pattern rs_clk and the data pattern rs_data generated by the pattern generator 1110 is in accordance with a system setup time, and when the pattern setup signal setup_result is logic "1", the phase relationship between the clock pattern rs_clk and the data pattern rs_data generated by the pattern generator 1110 is in accordance with a system hold time.

Here, an initial value of the pattern setup signal setup_result is assumed to be logic "0", which is referred to as a setup time testing mode. Since the pattern setup signal setup_result is logic "0", the pattern generator 1110 generates the clock pattern rs_clk and the data pattern rs_data that are in accordance with the system setup time. The first clock test_clk and the first data test_data are generated after the clock pattern rs_clk and the data pattern rs_data pass through the target circuit 520. The rotate register unit 535 circularly outputs the control data DC_con[n:1] to the phase adjuster 532. The phase adjuster 532 then determines a delay time of the second clock clk_delay and the second data data_delay under control of the control data DC_con[n:1]. The detector unit 1130 detects the phase relationship between the second clock clk_delay and the second data data_delay to judge whether or not a correct data may be latched. As the control data DC_con[n:1] changes, when the detector unit 1130 latches the correct data, the detector unit 1130 then outputs the pattern setup signal setup_result with logic "1" to the pattern generator 1110. Then, the phase-calibration circuit may perform a hold time testing.

When the pattern setup signal setup_result is logic "1", a hold time testing mode is presented. Since the pattern setup signal setup_result is logic "1", the pattern generator 1110 generates the clock pattern rs_clk and the data pattern rs_data that are in accordance with the system hold time. The rotate register unit 535 circularly outputs the control data DC_con[n:1] to the phase adjuster 532. The phase adjuster 532 determines a delay time of the second clock clk_delay and the second data data_delay under control of the control data DC_con[n:1]. The detector unit 1130 detects the phase relationship between the second clock clk_delay and the second data data_delay to judge whether or not a correct data may be latched.

When the detector unit 1130 latches the correct data for a first time, the detection result detect_result output from the detector unit 1130 then changes from logic "0" to logic "1", which may cause a counter within the optimization unit 534 to count once. Meanwhile, a register within the optimization unit 534 may record a value of the present control data DC_con[n:1]. Then, the value stored in the register of the optimization unit 534 will not change along with the detection result detect_result.

The rotate register unit 535 circularly changes the value of the control data DC_con[n:1]. When the control data DC_con[n:1] changes, the detection result output from the detector unit 1130 changes from logic "1" to logic "0", and then whether or not the detection result detect_result is again changed from logic "0" to logic "1" is determined by whether or not the correct data is latched. Therefore, when the detection unit 1130 continuously detects that the phase relationship between the second clock clk_delay and the second data data_delay is enough for latching the correct data, as the control data DC_con[n:1] circularly changes, the detection result detect_result may be changed in a sequence as 0, 1, 0, 1 . . . accordingly. The counter within the optimization unit 534 may also count variations of the detection result detect_result, until the detection result detect_result maintains the logic "0". Therefore, the value recorded by the counter of the optimization unit 534 is the number of the control data DC_con[n:1] being detected.

Since the rotate register unit 535 may circularly change the value of the control data DC_con[n:1], and therefore when the value of the control data DC_con[n:1] is cycled back to the value recorded within the register of the optimization unit 534, and since the value recorded by the counter of the optimization unit 534 is the number of the control data DC_con[n:1] being detected, and thus when the control data DC_con[n:1] again changes a number of times equals to "the value recorded within the register of the optimization unit 534/2", the optimization unit 534 may control the rotate register 535 according to the signal Optimal_signal to maintain the control data DC_con[n:1] for no longer changing circularly.

For example, referring to FIG. 6, when the value of the control data DC_con[n:1] is 4, the detector unit 1130 latches the correct data for the first time, and accordingly the detection result detect_result output from the detector unit 1130 changes from logic "0" to logic "1", such that the counter within the optimization unit 534 may count once. Meanwhile, the register within the optimization unit 534 may record the value of the present control data DC_con[n:1] as 4. Next, when the control data DC_con[n:1] is 8 and 16, the detection result detect_result is logic "1", and when the control data DC_con[n:1] is 32, the detection result detect_result is logic "0", it means when the control data DC_con[n:1]=4, 8 and 16, the phase adjuster 532 may respectively output a suitable phase relationship, and therefore the value recorded by the register within the optimization unit 534 is 3. The rotate register unit 535 may circularly change the value of the control data DC_con[n:1], and when the value of the control data DC_con[n:1] is again cycled back to 4 (identical to the value recorded within the register of the optimization unit 534), the optimization unit 534 counts from the control data DC_con[n:1]=4. When the control data DC_con[n:1] again changes a number of times equals to "3/2" (i.e. counting value of the counter within the optimization unit 534 is shifted 1 bit rightward, and therefore 3/2=1), namely, when the value of the control data DC_con[n:1] is again changed to 8, the optimization unit 534 may control the rotate register 535 according to the signal Optimal_signal to maintain the control data DC_con[n:1] as 8 for no longer changing circularly.

Figure 12:
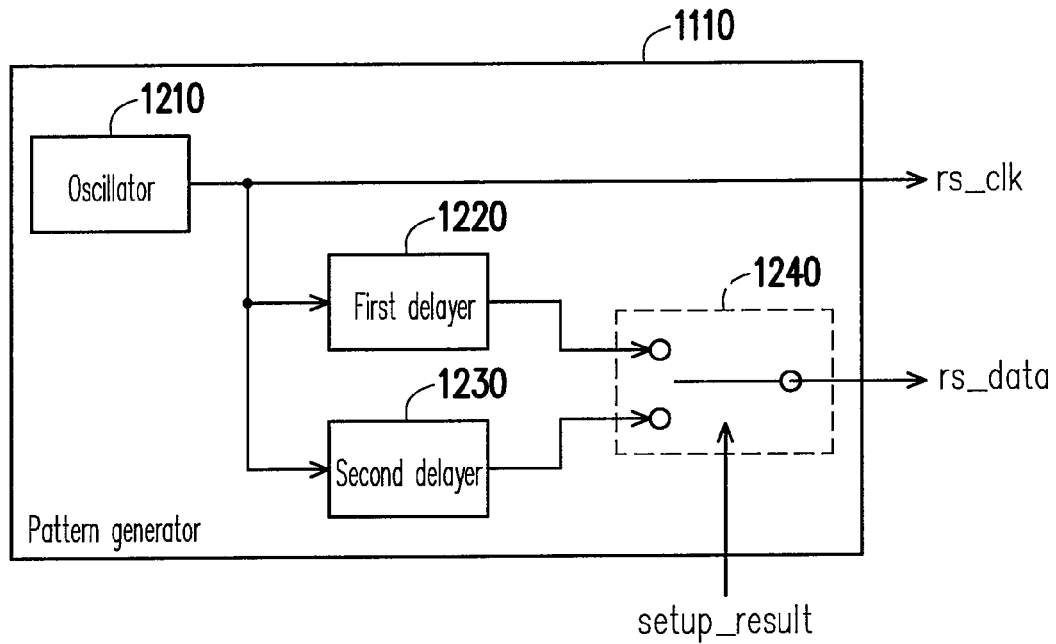
FIG. 12 is an example of the pattern generator of FIG. 11 according to an embodiment of the present invention.

FIG. 12 is an example of the pattern generator 1110 of FIG. 11 according to an embodiment of the present invention. The pattern generator 1110 includes an oscillator 1210, a first delayer 1220, a second delayer 1230 and a switcher 1240. The oscillator 1210 provides the clock pattern rs_clk. The first delayer 1220 and the second delayer 1230 respectively receive and delay the clock pattern rs_clk. The switcher 1240 selects one of the outputs of the first delayer 1220 and the second delayer 1230 as the output data pattern rs_data under control of the pattern setup signal setup_result.

Figure 13:
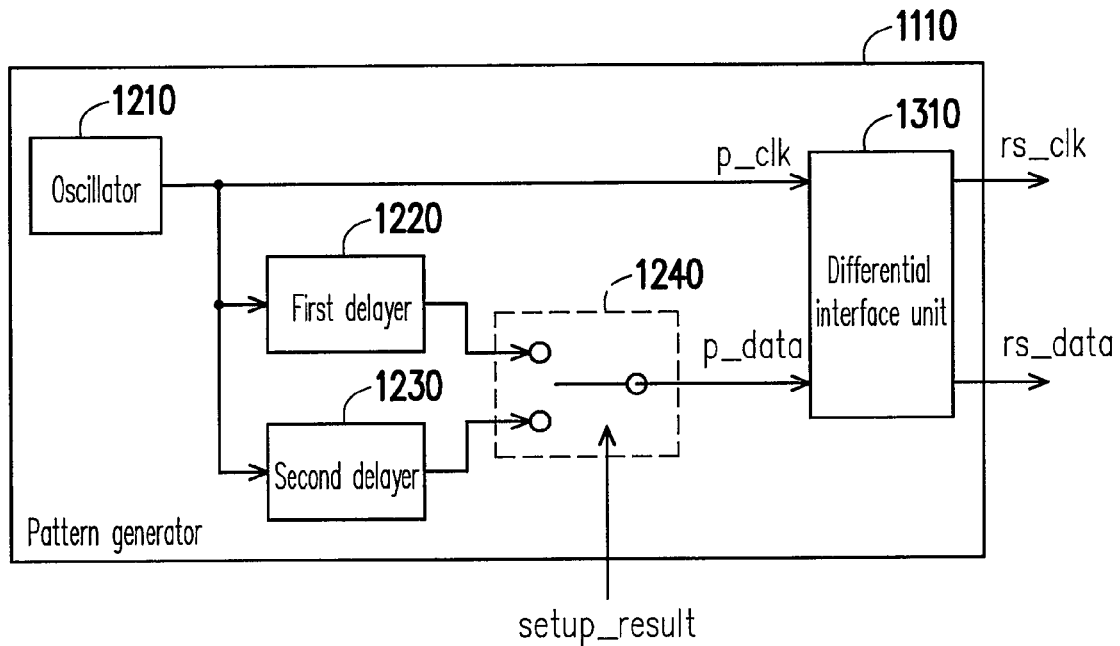
FIG. 13 is another example of the pattern generator of FIG. 11 according to an embodiment of the present invention.

Considering a specification of the system signals, a signal conversion circuit may also be allocated within the pattern generator 1110. For example, FIG. 13 is another example of the pattern generator 1110 of FIG. 11 according to an embodiment of the present invention. The pattern generator 1110 includes an oscillator 1210, a first delayer 1220, a second delayer 1230, a switcher 1240 and a differential interface unit 1310. The oscillator 1210 provides the original clock p_clk. The first delayer 1220 and the second delayer 1230 respectively receive and delay the original clock p_clk. The switcher 1240 selects one of the outputs of the first delayer 1220 and the second delayer 1230 as the output original data p_data under control of the pattern setup signal setup_result. The differential interface unit 1310 may convert the original clock p_clk and the original data p_data into the clock pattern rs_clk and the data pattern rs_data with a differential mode. The clock pattern rs_clk and the data pattern rs_data may be signals in accordance with the RSDS or other signal transmission interfaces. The circuit illustrated in FIG. 8 may also be taken as an embodiment of the differential interface unit 1310.

Figure 14:
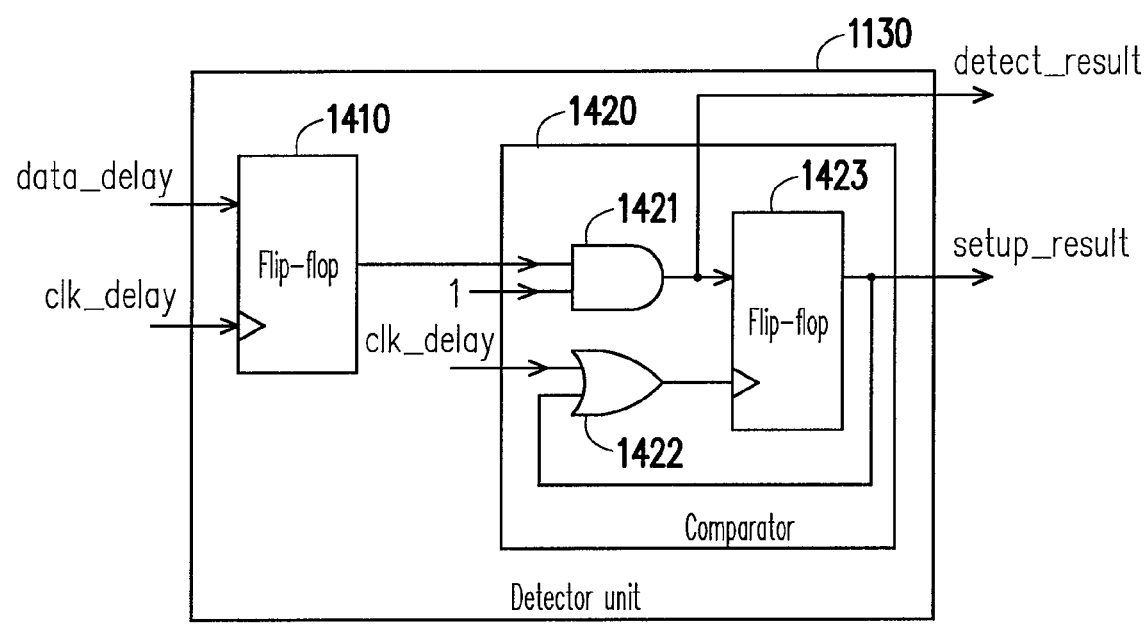
FIG. 14 is an example of the detector unit of FIG. 11 according to an embodiment of the present invention.

FIG. 14 is an example of the detector unit 1130 of FIG. 11 according to an embodiment of the present invention. In this embodiment, the detector unit 1130 includes a flip-flop 1410 and a comparator 1420. The flip-flop 1410 latches the second data data_delay according to the second clock clk_delay. The comparator 1420 detects whether or not the data latched by the flip-flop 1410 is correct, and outputs the detection result detect_result and the pattern setup signal setup_result. According to the phase relationship between the clock pattern rs_clk and the data patter rs_data generated by the pattern generator 1110, the comparator 1420 may compare whether or not the second data data_delay latched by the flip-flop 1410 is "1". Therefore, the detector unit 1130 may judge whether or not the adjusting result of the phase adjuster 532 is correct according to the latched second data data_delay, and may output the detection result detect_result and the pattern setup signal setup_result according to the above judgement.

The comparator 1420 includes an AND gate 1421, an OR gate 1422 and a second flip-flop 1423. A first input terminal of the AND gate 1421 is coupled to an output terminal of the flip-flop 1410, a second input terminal of the AND gate 1421 receives a logic value (logic "1"), and an output terminal of the AND gate outputs the detection result detect_result. A first input terminal of the OR gate 1422 receives the second clock clk_delay. The trigger terminal of the second flip-flop 1423 is coupled to an output terminal of the OR gate 1422, an input terminal of the second flip-flop 1423 is coupled to the output terminal of the AND gate 1421, and an output terminal of the second flip-flop 1423 is coupled to a second input terminal of the OR gate 1422. Wherein, the output terminal of the second flip-flop 1423 outputs the pattern setup signal setup_result to the pattern generator 1110, such that the pattern generator 1110 may further adjust the phase of the data pattern rs_data and/or the clock pattern rs_clk according to the pattern setup signal setup_result.

In summary, according to the aforementioned embodiments, the phase-calibration circuit may detect the output of the target circuit via the detector unit, and may dynamically select the required delay time according to the detection result. Therefore, the setup time problem and the hold time problem occurred due to delay offset may be dynamically modified according to the embodiments of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A phase-calibration circuit for calibrating a target circuit, comprising:
   a pattern generator, for generating a clock pattern and a data pattern for the target circuit;
   a phase adjuster, for receiving a first clock and a first data output from the target circuit, and adjusting a phase relationship between the first clock and the first data according to a control data, so as to output a second clock and a second data;
   a rotate register unit, for providing the control data to the phase adjuster and changing the control data according to a predetermined timing;
   a detector unit, coupled to the phase adjuster, for detecting a phase relationship between the second clock and the second data to output a detection result; and
   an optimization unit, coupled to the detector unit and the rotate register unit, for recording the control data output from the rotate register unit according the detection result to select one of the control data as a calibration control data, and controlling the rotate register unit to output the calibration control data to the phase adjuster.

2. The phase-calibration circuit as claimed in claim 1, wherein the detector unit outputs a pattern setup signal to the pattern generator according to the phase relationship between the second clock and the second data, and the pattern generator adjusts a phase of the data pattern according to the pattern setup signal.

3. The phase-calibration circuit as claimed in claim 2, wherein the pattern generator comprises:
   an oscillator, for providing the clock pattern;
   a first delayer, for receiving and delaying the clock pattern;
   a second delayer, for receiving and delaying the clock pattern; and
   a switcher, for selecting one of the outputs of the first delayer and the second delayer as the data pattern under control of the pattern setup signal.

4. The phase-calibration circuit as claimed in claim 2, wherein the pattern generator comprises:
   an oscillator, for providing an original clock;
   a first delayer, for receiving and delaying the original clock;
   a second delayer, for receiving and delaying the original clock;
   a switcher, for selecting one of the outputs of the first delayer and the second delayer as an original data under control of the pattern setup signal; and
   a differential interface unit, for respectively converting the original clock and the original data into the clock pattern and the data pattern with a differential mode.

5. The phase-calibration circuit as claimed in claim 1, wherein the phase adjuster comprises:
   a delay selector, for receiving the first data output from the target circuit, and delaying the first data according to the control data to output as the second data,
   wherein the second clock is the first clock.

6. The phase-calibration circuit as claimed in claim 5, wherein the delay selector comprises:
   a delayer unit string, formed by serially connecting a plurality of delayer units, wherein an input terminal of a first delayer unit of the delayer units string receives the first data; and
   a plurality of switches, with first ends respectively coupled to output terminals of the delayer units, wherein one of the switches is turned on under control of the control data to output the second data.

7. The phase-calibration circuit as claimed in claim 1, wherein the phase adjuster comprises:
   a delay selector, for receiving the first clock output from the target circuit, and delaying the first clock according to the control data to output as the second clock,
   wherein the second data is the first data.

8. The phase-calibration circuit as claimed in claim 1, wherein the detector unit comprises:
   a flip-flop, for latching the second data according to the second clock; and
   a comparator, for detecting whether the data latched by the flip-flop is correct, and outputting the detection result.

9. The phase-calibration circuit as claimed in claim 8, wherein the comparator comprises:
   an AND gate, comprising a first input terminal coupled to an output terminal of the flip-flop, a second input terminal receiving a logic value, and an output terminal outputting the detection result.

10. The phase-calibration circuit as claimed in claim 9, wherein the comparator further comprises:
    an OR gate, comprising a first input terminal for receiving the second clock; and
    a second flip-flop, comprising a trigger terminal coupled to an output terminal of the OR gate, a input terminal coupled to the output terminal of the AND gate, and an output terminal coupled to a second input terminal of the OR gate, wherein the output terminal of the second flip-flop outputs a pattern setup signal to the pattern generator, and the pattern generator adjusts a phase of the data pattern according to the pattern setup signal.

11. A display driver, comprising:
    a receiver, for receiving an external signal; and
    a phase-calibrating circuit, built in the display driver, for calibrating the receiver, the phase-calibrating circuit comprising:
    a pattern generator, for generating a clock pattern and a data pattern for the receiver;
    a phase adjuster, for receiving a first clock and a first data output from the receiver, and adjusting a phase relationship between the first clock and the first data according to a control data, so as to output a second clock and a second data;
    a rotate register unit, for providing the control data to the phase adjuster and changing the control data according to a predetermined timing;
    a detector unit, coupled to the phase adjuster, for detecting a phase relationship between the second clock and the second data to output a detection result; and
    an optimization unit, coupled to the detector unit and the rotate register unit, for recording the control data output from the rotate register unit according the detection result to select one of the control data as a calibration control data, and controlling the rotate register unit to output the calibration control data to the phase adjuster.

12. The display driver as claimed in claim 11, wherein the detector unit outputs a pattern setup signal to the pattern generator according to the phase relationship between the second clock and the second data, and the pattern generator adjusts a phase of the data pattern according to the pattern setup signal.

13. The display driver as claimed in claim 12, wherein the pattern generator comprises:
   an oscillator, for providing the clock pattern;
   a first delayer, for receiving and delaying the clock pattern;
   a second delayer, for receiving and delaying the clock pattern; and
   a switcher, for selecting one of the outputs of the first delayer and the second delayer as the data pattern under control of the pattern setup signal.

14. The display driver as claimed in claim 12, wherein the pattern generator comprises:
   an oscillator, for providing an original clock;
   a first delayer, for receiving and delaying the original clock;
   a second delayer, for receiving and delaying the original clock;
   a switcher, for selecting one of the outputs of the first delayer and the second delayer as an original data under control of the pattern setup signal; and
   a differential interface unit, for respectively converting the original clock and the original data into the clock pattern and the data pattern with a differential mode.

15. The display driver as claimed in claim 11, wherein the phase adjuster comprises:
   a delay selector, for receiving the first data output from the receiver, and delaying the first data according to the control data to output as the second data,
   wherein the second clock is the first clock.

16. The display driver as claimed in claim 15, wherein the delay selector comprises:
   a delayer unit string, formed by serially connecting a plurality of delayer units, wherein an input terminal of a first delayer unit of the delayer units string receives the first data; and
   a plurality of switches, comprising first ends respectively coupled to output terminals of the delayer units, wherein one of the switches is turned on under control of the control data to output the second data.

17. The display driver as claimed in claim 11, wherein the phase adjuster comprises:
   a delay selector, for receiving the first clock output from the receiver, and delaying the first clock according to the control data to output as the second clock,
   wherein the second data is the first data.

18. The display driver as claimed in claim 11, wherein the detector unit comprises:
   a flip-flop, for latching the second data according to the first clock; and
   a comparator, for detecting whether the data latched by the flip-flop is correct, and outputting the detection result.

19. The display driver as claimed in claim 18, wherein the comparator comprises:
   an AND gate, comprising a first input terminal coupled to an output terminal of the flip-flop, a second input terminal receiving a logic value, and an output terminal outputting the detection result.

20. The display driver as claimed in claim 19, wherein the comparator further comprises:
   an OR gate, comprising a first input terminal receiving the second clock; and
   a second flip-flop, comprising a trigger terminal coupled to an output terminal of the OR gate, a input terminal coupled to the output terminal of the AND gate, and an output terminal coupled to a second input terminal of the OR gate, wherein the output terminal of the second flip-flop outputs a pattern setup signal to the pattern generator, and the pattern generator further adjusts a phase of the data pattern according to the pattern setup signal.

* * * * *